United States Patent [19]

Colegrove et al.

[11] Patent Number: 4,687,902

[45] Date of Patent: Aug. 18, 1987

[54] ELECTRON-BEAM WELDING APPARATUS

[75] Inventors: Russell K. Colegrove, East Longmeadow, Mass.; Glen S. Lawrence, Windsorville, Conn.

[73] Assignee: Leybold-Heraeus GmbH, Cologne, Fed. Rep. of Germany

[21] Appl. No.: 763,024

[22] Filed: Aug. 6, 1985

[51] Int. Cl.[4] .............................................. B23K 15/00
[52] U.S. Cl. .................... 219/121 ET; 219/121 EZ; 219/121 EA
[58] Field of Search .................. 219/121 ET, 121 EZ, 219/121 EA, 121 EP, 121 EB, 121 EL, 121 ED, 121 EE, 121 EF, 121 EG, 121 EH, 121 EJ, 121 EK, 121 EL, 121 EN; 313/237, 32

[56] References Cited

U.S. PATENT DOCUMENTS

| | | | |
|---|---|---|---|
| 3,187,216 | 6/1965 | Sciaky | 313/237 |
| 3,842,236 | 10/1974 | Von Walter | 219/121 EP X |
| 4,008,112 | 1/1978 | Marhic | 219/121 EP X |
| 4,084,076 | 4/1978 | Istomin et al. | 219/121 EZ X |
| 4,574,178 | 3/1986 | Spruck | 219/121 EZ X |

*Primary Examiner*—C. L. Albritton
*Attorney, Agent, or Firm*—Felfe & Lynch

[57] ABSTRACT

Electron beam welding apparatus, suitable as a mobile welding apparatus, having a solid dielectric insulator for the high voltage electrical conductors and also having liquid coolants for cooling the conductors and the insulator which are heated by the cathode. The apparatus also includes a valve for sealing the cathode and the anode in an outer housing in one position of the valve and for allowing the passage therethrough of an electron beam in another position of the valve and for providing precision television optical viewing of the welded seam. The apparatus also includes high-voltage connecting apparatus including a plug having a resilient tapered insulating member and a socket in the solid dielectric insulator, and having the shape of a tapered opening for the plug for exerting laterally compressive forces on the plug as the plug is inserted into the socket to avoid trapping air in the socket. The electron beam gun includes a conductive cartridge having a housing for disposition around a conductive base member and having a bayonet lock protruding internally therefrom for locking in the recess of the base member. The cartridge allows changing of the cartridge in a few minutes or changing of the cathode filament in a few minutes.

10 Claims, 16 Drawing Figures

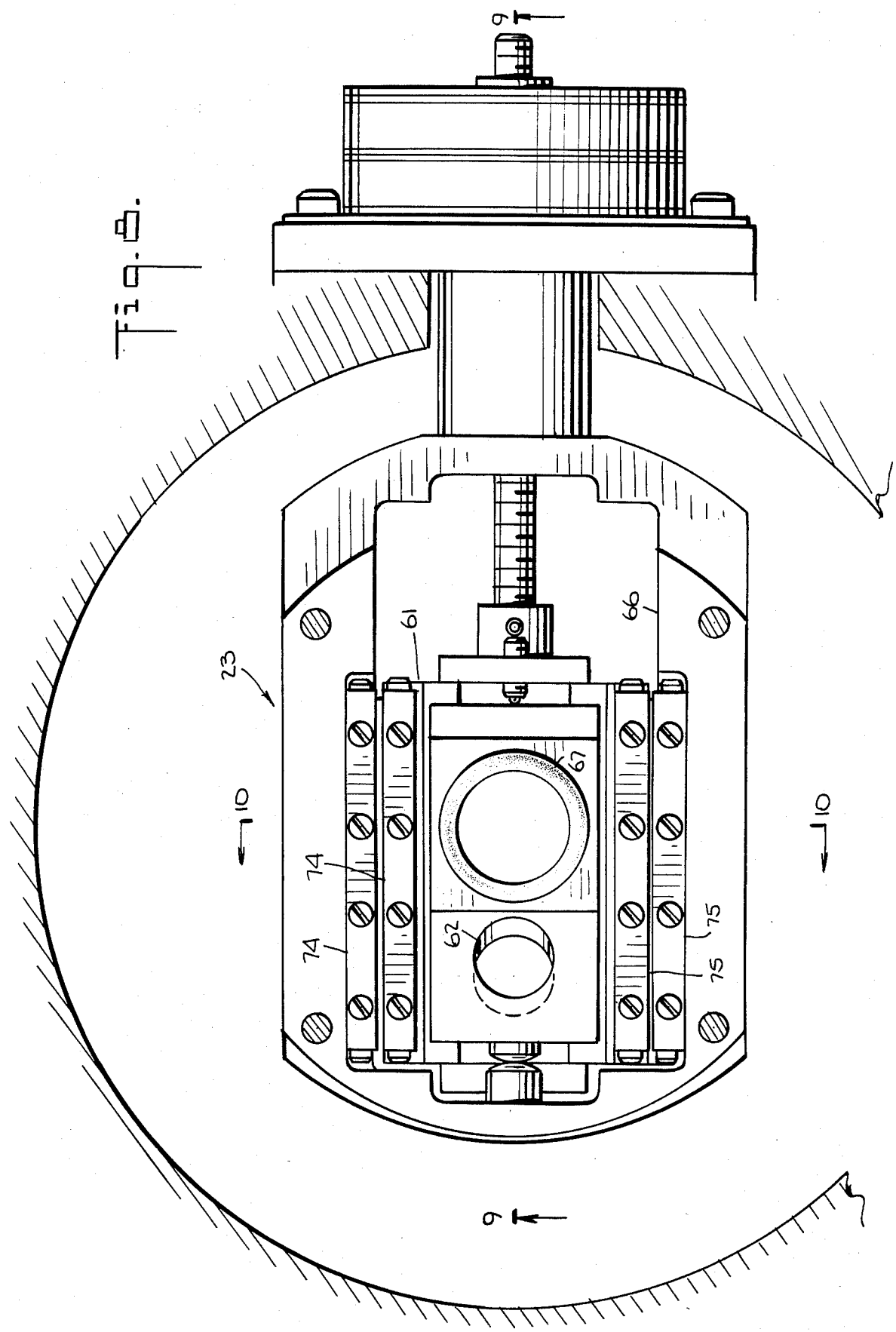

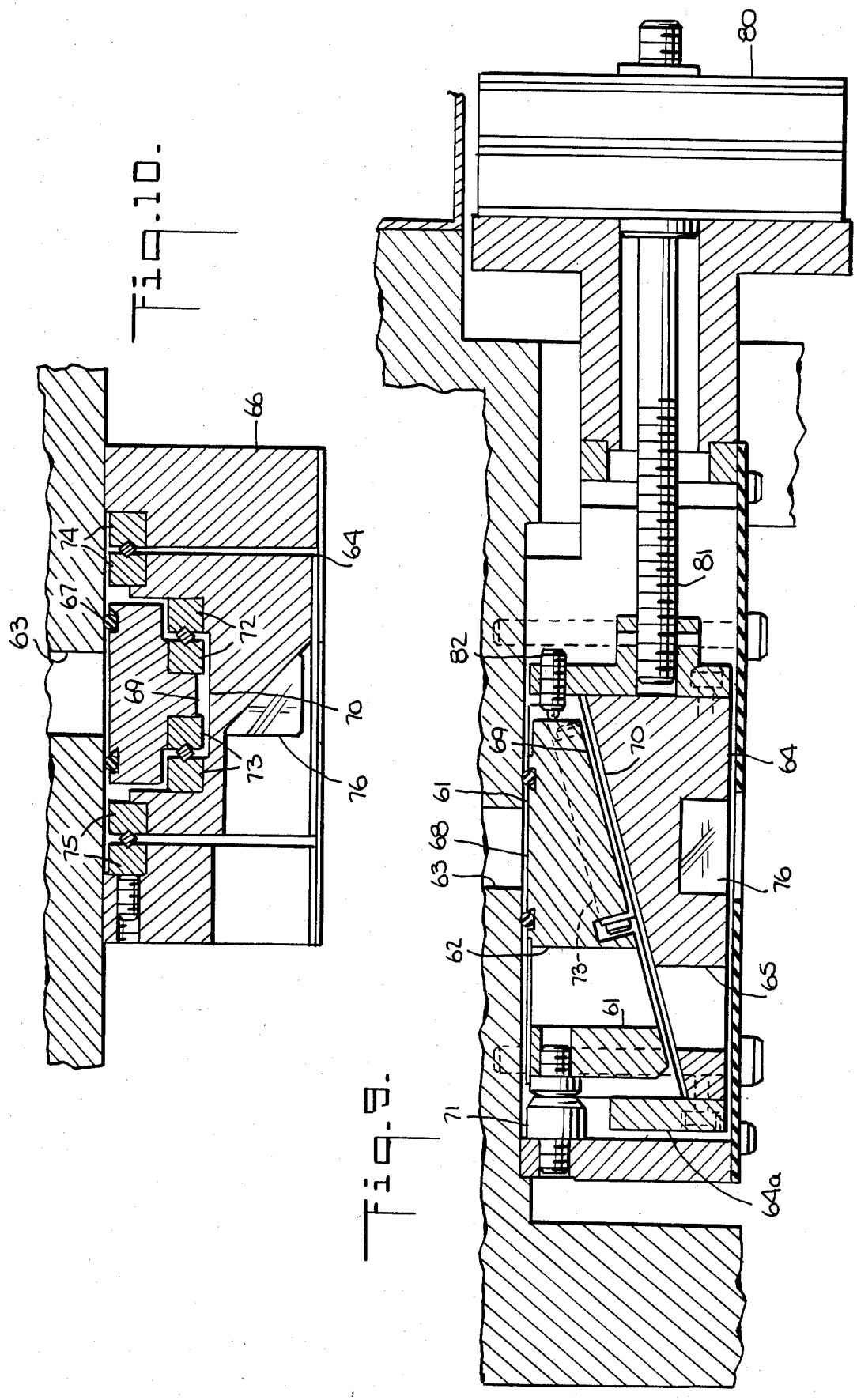

ELECTRON-BEAM WELDING APPARATUS

This invention relates to electron-beam welding apparatus and, more particularly, to such apparatus suitable for use as mobile welding apparatus The invention also relates to a valve for the electron-beam welding apparatus, and to high-voltage connecting apparatus for the electron-beam welding apparatus.

Heretofore, electron-beam welding apparatus has ordinarily used a dielectric oil reservoir for cooling of the housing for the high-voltage connection in welding apparatus having fixed position electron-beam guns. Such apparatus is heavier than is desired for a mobile electron-beam welding apparatus.

In electron-beam welding apparatus, there ordinarily is provided an isolation valve between the cathode of the gun and the electron beam output face of the apparatus for sealing the electron-beam gun to maintain a vacuum therein when the vacuum chamber of the welding apparatus is opened. Prior isolation valves have been of more complex construction than is desirable and have utilized sliding seals which are subject to wear.

Prior fixed electron-beam welding guns have utilized filament cartridges for the cathode which are larger and more complex than is desirable for mobile electron-beam guns.

Suitable high-voltage connecting apparatus for electron-beam welding apparatus have generally not been entirely effective to prevent air voids at the connecting apparatus, which can result in high voltage arcing.

It is an object of the present invention, therefore, to provide a new and improved electron-beam welding apparatus which avoids one or more of the above-mentioned disadvantages and limitations of prior such apparatus.

It is another object of the invention to provide a new and improved mobile electron-beam welding apparatus which avoids one or more of the above-mentioned disadvantages and limitations of prior such apparatus.

It is another object of the invention to provide a new and improved isolation valve for electron-beam welding apparatus which avoids one or more of the above-mentioned disadvantages and limitations of prior such valves.

It is another object of the invention to provide a new and improved electron-beam welding apparatus which includes an improved cartridge for a cathode filament therein which avoids one or more of the above-mentioned disadvantages and limitations of prior such cartridges.

It is another object of the invention to provide a new and improved high-voltage connecting apparatus for electron-beam welding apparatus which avoids one or more of the above-mentioned disadvantages and limitations of prior such apparatus.

In accordance with the invention, electron-beam welding apparatus comprises an outer housing and solid dielectric insulator means in the outer housing and having electrical conductors disposed therein and having a first liquid flow path associated therewith. The apparatus includes a cathode connected through the conductors in the insulator means to high-voltage supply means, the first liquid flow path having a portion near the conductors for a first liquid for cooling the conductors and the insulator means, which are heated by the cathode, by flow of the first liquid in the path. The apparatus also includes a second liquid flow path near an outer portion of the dielectric insulator means and near the first liquid flow path for a second liquid for cooling the first liquid. The apparatus also includes an anode and valve means for sealing the cathode and the anode in the outer housing in one position of the valve and for allowing the passage therethrough of an electron beam in another position of the valve. The apparatus also includes means for controlling the electron beam.

Also in accordance with the invention, in electron-beam welding apparatus, high-voltage connecting apparatus comprises a plug including a resilient tapered insulating member having a pair of high-voltage members and a third high-voltage member extending therefrom. The connecting apparatus includes an assembly comprising an electron-beam gun and insulator means forming a socket having a pair of cathode connection members for engagement with the pair of high-voltage members and a third conductive bias connection member for engagement with the third high-voltage member. The socket has the shape of a tapered opening for the plug for exerting laterally compressive forces on the plug as the plug is inserted into the socket, thereby avoiding trapping air in the socket.

Also in accordance with the invention, electron-beam welding apparatus comprises insulating means having extending therefrom a pair of high-voltage terminals and a high-voltage bias terminal. The apparatus includes a conductive base member conductively attached to the bias terminal and disposed around and insulated from the pair of high-voltage terminals. The base member has a bayonet lock recess therein. The apparatus also includes an electron-beam gun including a cartridge for disposition around the base member and having a bayonet lock protruding internally therefrom for locking in the recess of the base member. The apparatus also includes a pair of high-voltage terminals supported in the cartridge housing for connection to the pair of high-voltage terminals insulated from the base member. The apparatus also includes a cathode filament included in the cartridge and connected to the pair of high-voltage terminals in the housing.

Also in accordance with the invention, in electron-beam welding apparatus, a valve for allowing an electron beam to pass along a path in one portion of the apparatus to another portion of the apparatus, in an open position of the valve, and for isolating the one portion of the apparatus from the other, in a closed position of a valve, comprises driven means having a passage for the electron beam therethrough in one position and for sealing an opening for the electron beam in the apparatus in another position. The valve also includes drive means having a passage for the electron beam therethrough in one position and displaceable transversely of the electron-beam path for displacing the driven means transversely of the electron-beam path and for displacing the driven means axially of the electron-beam path in a final increment of displacement for sealing the opening in the apparatus.

For a better understanding of the present invention, together with other and further objects thereof, reference is made to the following description, taken in connection with the accompanying drawings, and its scope will be pointed out in the appended claims.

Referring now to the drawings:

FIG. 8 is a plan view, to an enlarged scale, of a portion of the FIG. 2 apparatus including an isolation valve, taken along line 8—8 of FIG. 2;

FIG. 9 is a sectional view of the FIG. 8 apparatus, taken along line 9—9 of FIG. 8;

FIG. 10 is a sectional view of the FIG. 8 apparatus, taken along line 10—10 of FIG. 8;

Figure 1:
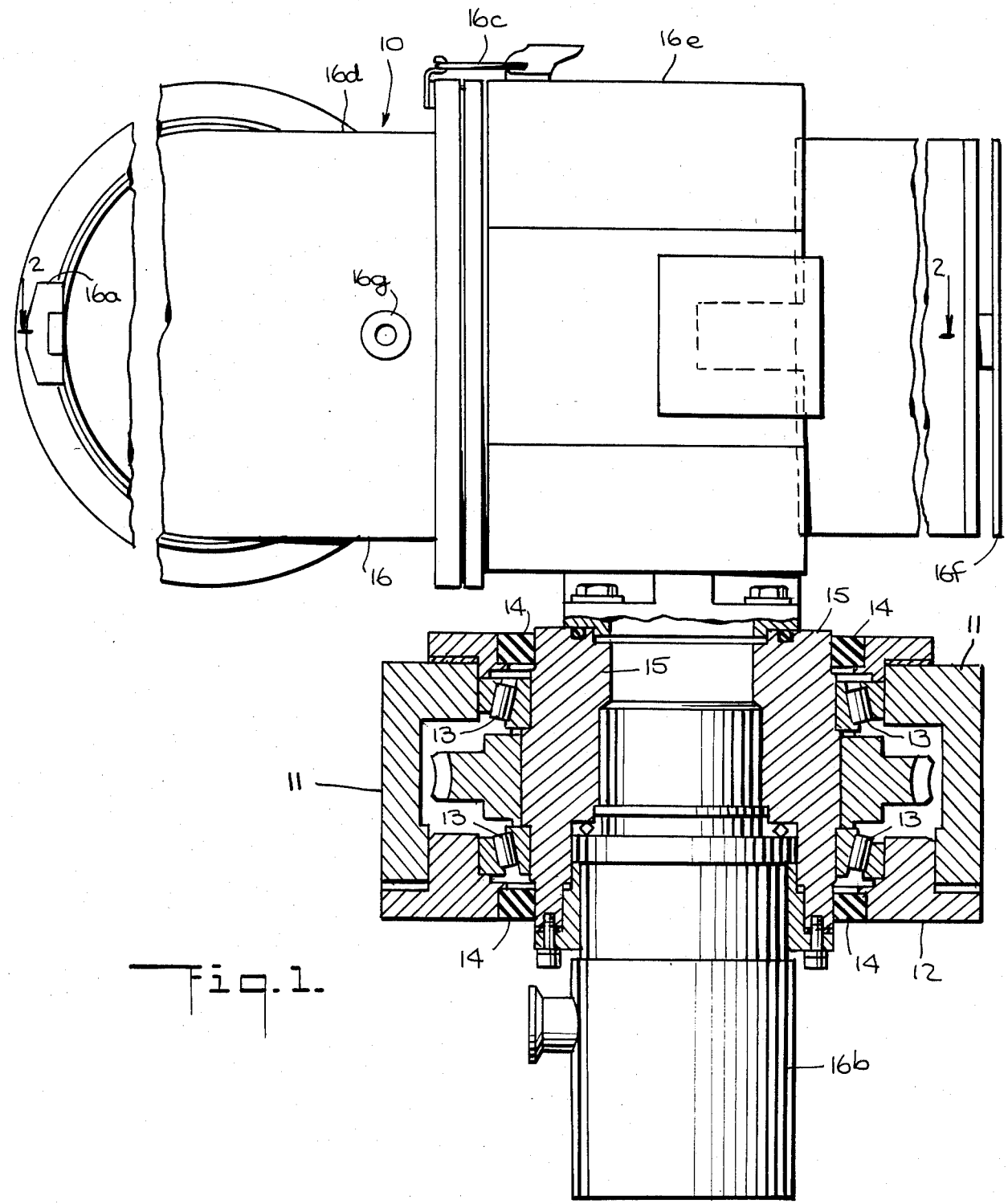
FIG. 1 is a fragmentary, elevational view, partly in section, of electron-beam welding apparatus constructed in accordance with the invention and suitable for use as mobile welding apparatus.

Referring now more particularly to FIG. 1 of the drawings, there is represented electron-beam welding apparatus 10 in accordance with the invention and suitable for use as mobile welding apparatus. The electron-beam welding apparatus 10 is normally operated in a vacuum chamber (not shown). A suitable mount for the apparatus is represented as ring members 11, 12 on which an electron-beam gun is rotatably mounted by roller bearings 13 for being power rotated by a worm gear 13a. Suitable elastomeric lip seals 14 are disposed between a support 15 for the electron-beam gun and the mounting members 11, 12. The apparatus 10 has an outer housing 16 represented in fragmentary view in FIG. 1. A water inlet-outlet 16a is provided on the housing 16 for cooling the apparatus as will be described hereinafter. Also, an oil inlet 16g is provided in the housing 16 for cooling oil filling as will be described hereinafter. A turbomolecular pump 16b is provided for maintaining a vacuum in the electron-beam gun. Suitable toggle latches such as latch 16c may be utilized to connect two outer housing portions 16d, 16e. A seam tracker antenna 16f is provided to collect back scattered electrons that can be used to locate the weld joint.

Figure 2:
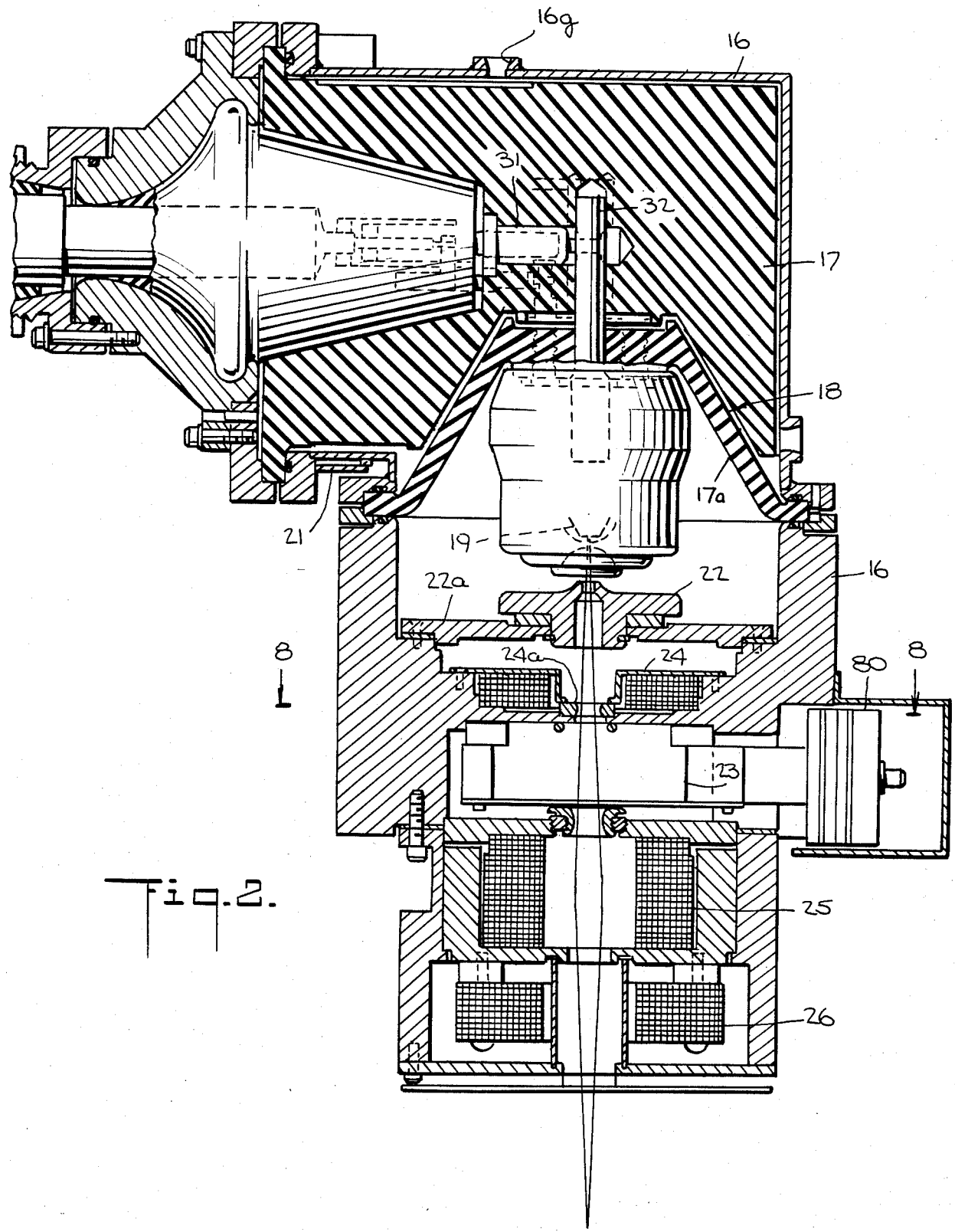
FIG. 2 is a sectional view of the FIG. 1 apparatus, taken along line 2—2 of FIG. 1.

Referring now more particularly to FIG. 2 of the drawings, the outer housing 16, which preferably is of aluminum, encloses solid dielectric insulator means 17, 17a having an internal liquid flow path or labyrinth 18 for liquid oil which cools the region near the cathode connection members 32.

Figure 3:
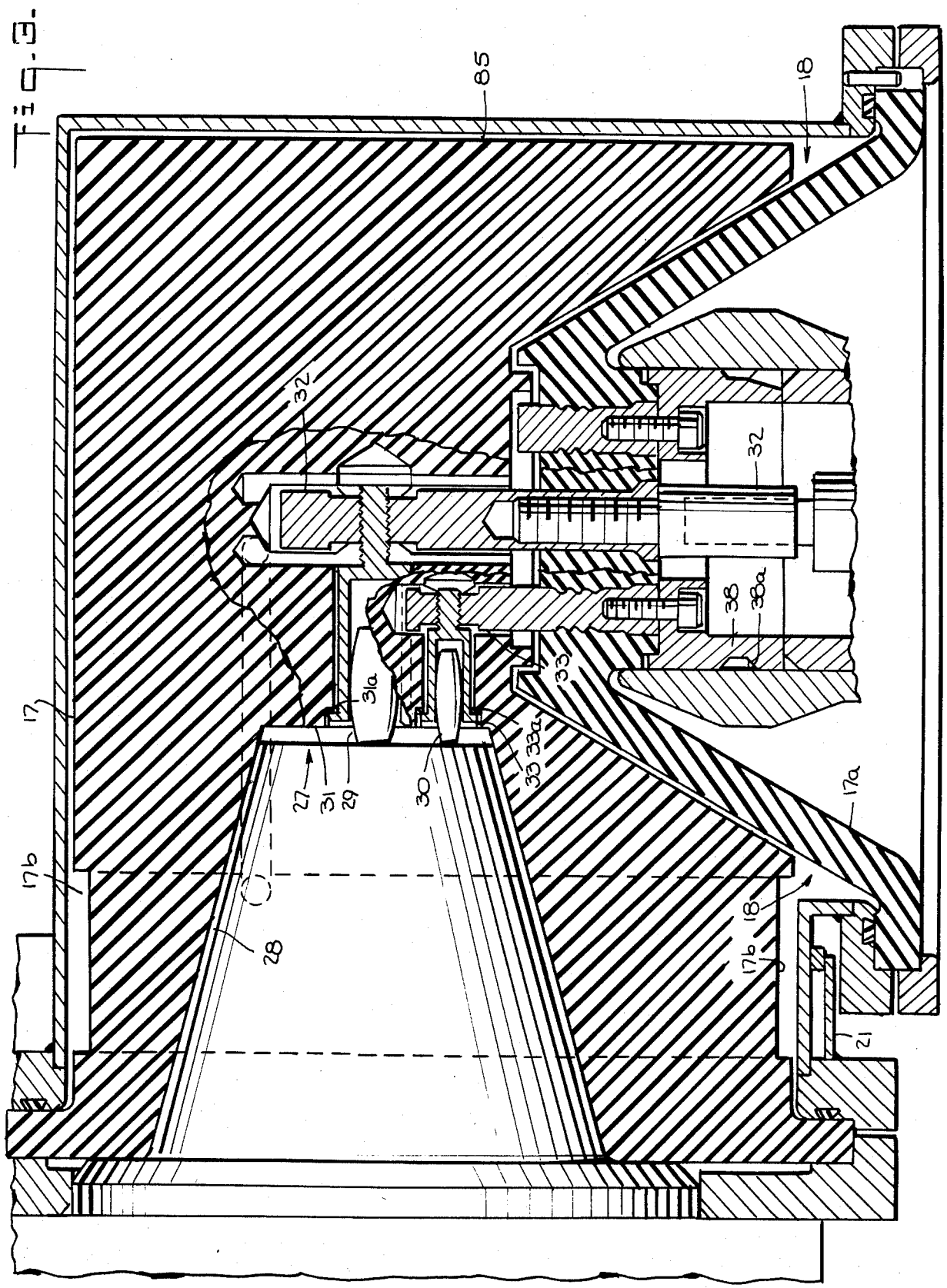
FIG. 3 is a fragmentary, sectional view, to an enlarged scale, of a portion of the FIG. 2 apparatus.
Figure 4:
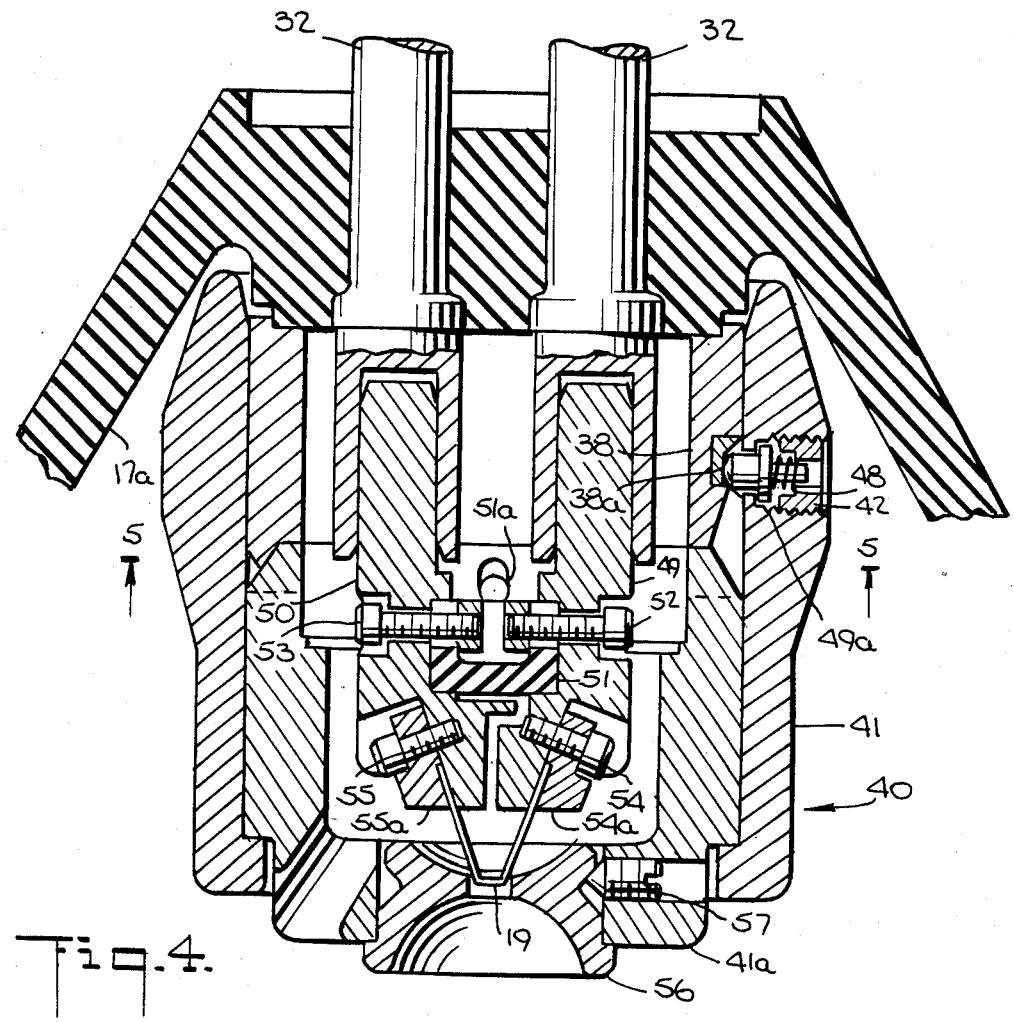
FIG. 4 is a sectional view, to an enlarged scale, of a portion of the FIG. 2 apparatus.

A cathode filament 19, represented to an enlarged scale in FIG. 4, is connected through insulators 17, 17a to high-voltage supply means 29, represented to an enlarged scale in FIG. 3. The first liquid flow path 18 has a portion near the conductors 32 for cooling the insulator means 17, 17a heated by the conductors 32 and for cooling the conductors 32 heated by the cathode, by flow of the first liquid, preferably dielectric cooling oil, in the path 18. The oil preferably is circulated by convection due to temperature differentials and due to the electrostatic field within the housing, from a region of higher temperature to a region of cooler temperature or the oil may optionally be circulated by use of a suitable pump (not shown). The oil flow path 18 has sufficiently long passages displaced from one another to prevent arcing.

Referring now to FIGS. 2, 13, 14, 15 and 16, the oil flow path 18 includes an outer region 85 between the insulator 17 and the housing 16. Passages 86, 87 connect the outer region 85 with oil flow regions 88, 89, 90, 91 and 92 surrounding the cathode conductors and bias conductor in the insulator 17. Passages 93, 94, 95 also connect the region surrounding the cathode conductors and the bias conductor with the oil flow region 85 between the insulator 17 and the housing 16. An oil flow region 96 interconnects the passages 91, 92, 92a surrounding the cathode connectors and the bias connector. Apertures 97, 97 and 98, 98 are included to interconnect the passages 88, 89 with the passages 86, 87.

Figure 13:
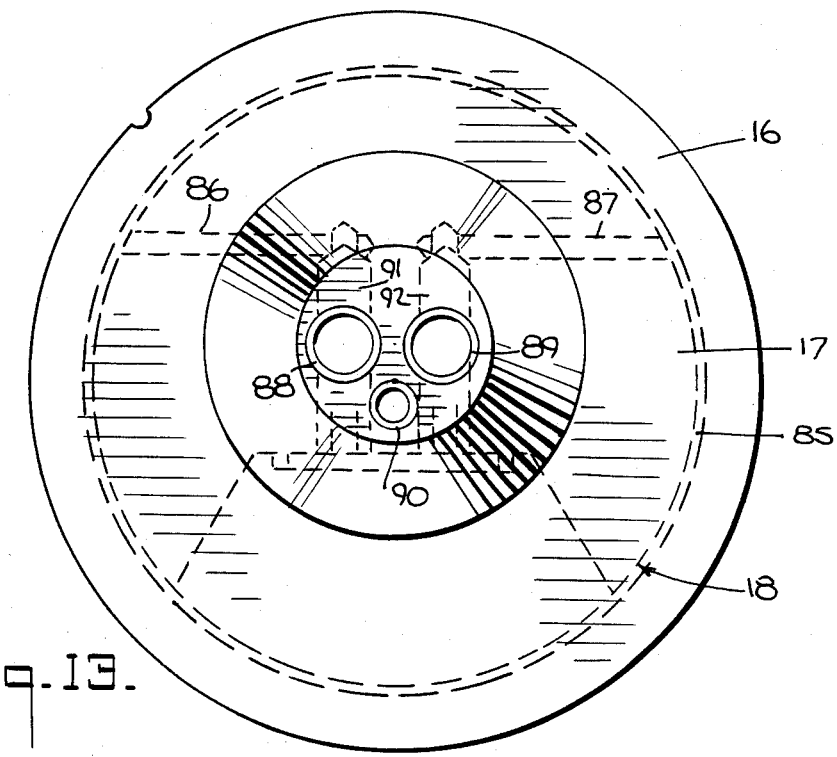
FIG. 13 is an end elevational view of the insulator in its housing as seen from the left end of FIG. 3.
Figure 14:
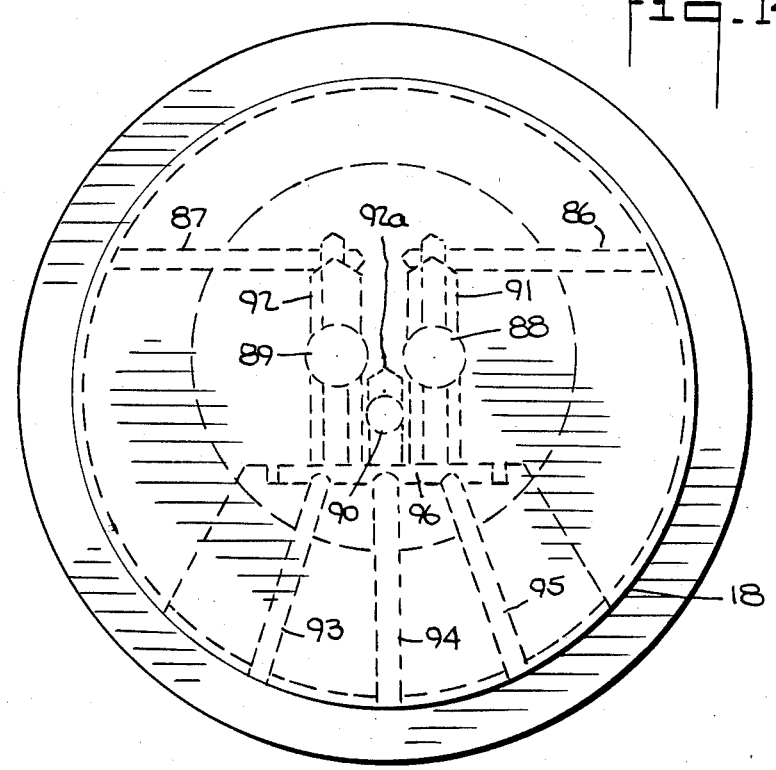
FIG. 14 is an end elevational view of the insulator in its housing as seen from the right end of FIG. 3.
Figure 16:
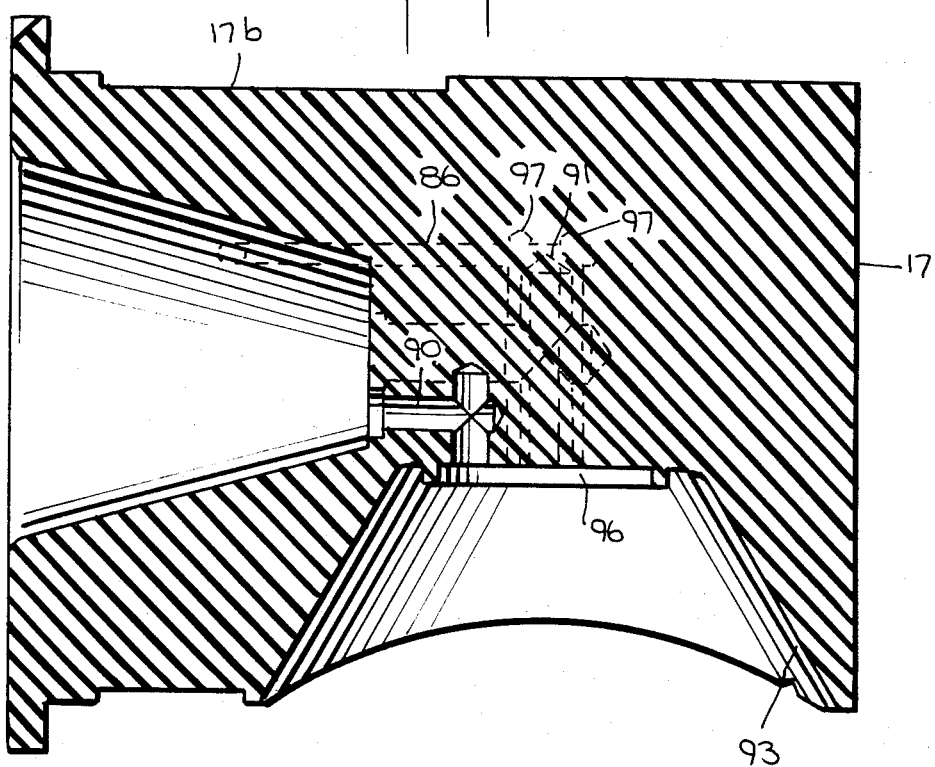
FIG. 16 is a sectional view of the FIG. 15 insulator taken line 16—16 of FIG. 15.
Figure 15:
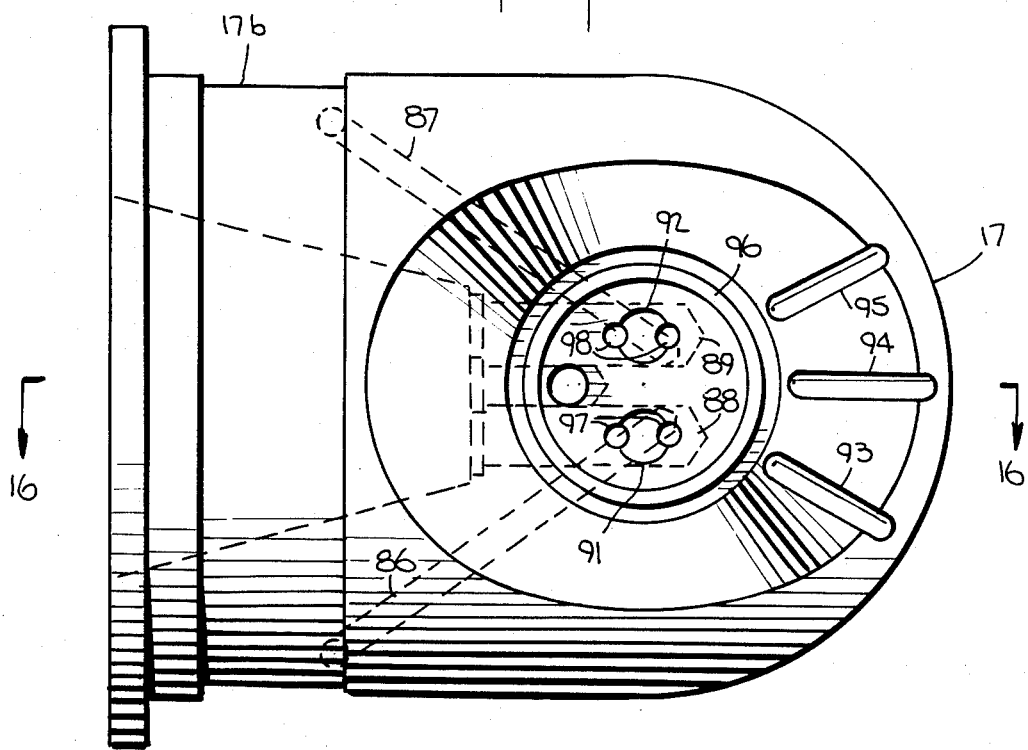
FIG. 15 is a bottom plan view of the insulator alone as seen in FIG. 3 with a portion removed.

As will be noted in FIGS. 2 and 13, the oil passages 88, 89, 90 extend around the cathode conductors and the bias conductor to the face of the socket in the insulator 17. The resilient connector 28 is capable of maintaining a dry connection at the socket of the insulator 17 so that there is not oil leakage from the welding apparatus.

The oil is further sealed inside of housing 16 by compressing an 'O' ring seals 31a, 33a between members 31, 33 and insulator 17.

Referring again to FIGS. 2 and 3, a second liquid flow path 21, preferably a ring 21 for circulating cooling water, near an outer recessed portion 17b of the dielectric insulator 17 adjacent the first liquid or oil flow path 18 is supplied for cooling the oil.

The electron-beam welding apparatus also includes an anode 22, preferably at ground potential and positioned by an anode support plate 22a, and valve means 23 for sealing the cathode and the anode in the housing 16 in one position of the valve and for allowing the passage therethrough of an electron beam in another position of the valve.

The electron beam welding apparatus also includes means for controlling the electron beam comprising a beam alignment winding 24 and alignment diaphragm 24a, focusing winding 25 and deflection winding 26.

Figure 11:
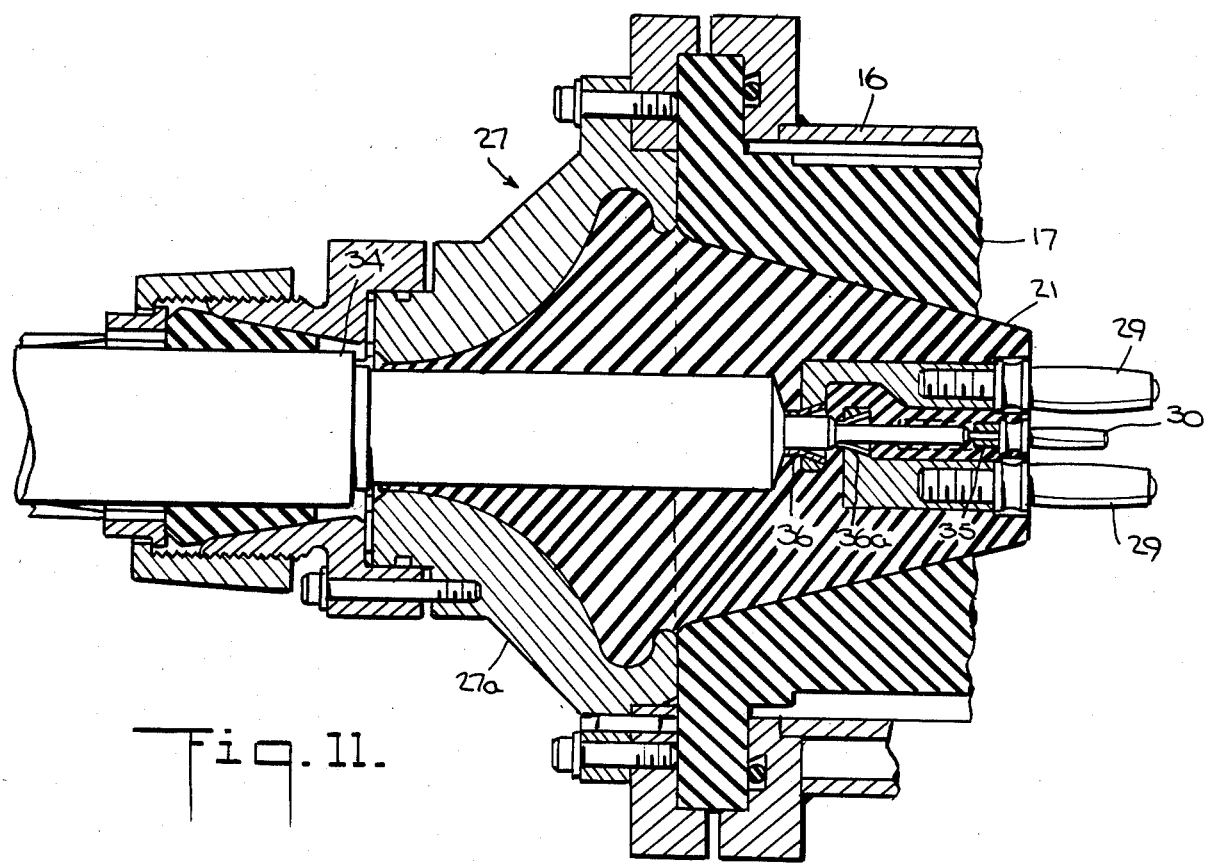
FIG. 11 is a sectional view of a plug for mating with the FIG. 2 apparatus, represented as positioned in a portion of the FIG. 2 apparatus.

Referring now more particularly to FIG. 3 of the drawings, high-voltage connecting apparatus comprises a plug 27 including a resilient tapered insulating member 28 having a pair of conductive high-voltage members 29 (only one of which appears in FIG. 3, the other appearing in FIG. 11). The apparatus includes a third conductive high-voltage member 30 extending from the plug 27. The plug 27 preferably is of soft silicone rubber.

The apparatus also includes an assembly comprising an electron-beam gun and insulator means 17 forming a socket 31 having a pair of conductive cathode connection members 32, (only one of which appears in FIG. 3, the other appearing in FIG. 4) for engagement with the pair of high-voltage members 29. The high-voltage connecting apparatus also includes a third conductive bias connection member 33 for engagement with the third high-voltage member 30. The socket has the shape of a tapered opening for the plug for exerting laterally compressive forces on the plug as the plug is inserted into the socket, thereby avoiding trapping air in the socket.

Figure 12:
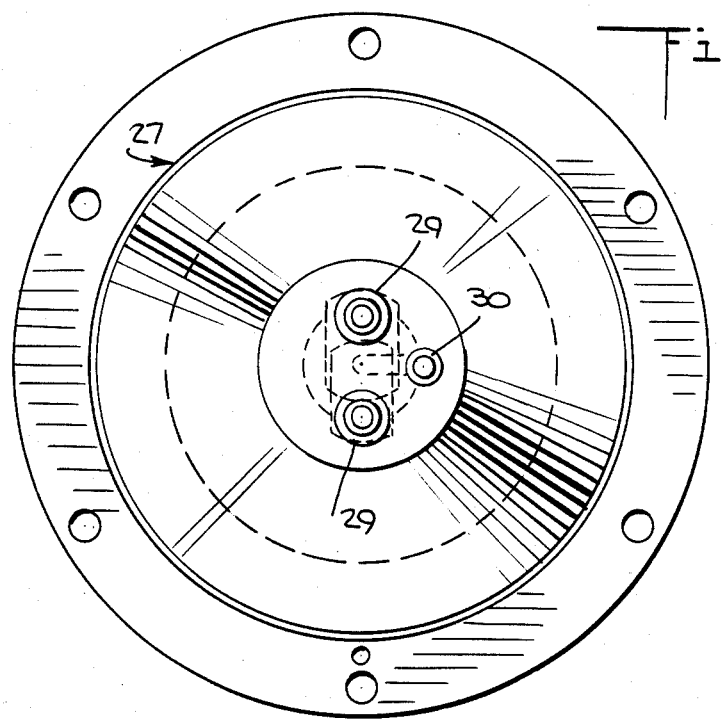
FIG. 12 is an end elevational view of the FIG. 11 plug.

As represented in FIGS. 11 and 12, a high-voltage cable 34 preferably has its innermost conductor 35 connected to the bias terminal 30. A conductive layer 36 of the cable is conductively connected to one of the terminals 29 and a conductive layer 36a is conductively connected to the other of the terminals 29. The plug 27 preferably has a metal outer housing 27a which is bolted to the outer housing 16 of the welding apparatus.

Referring now more particularly to FIGS. 3, 4, 5, 6 and 7, the insulating means 17, 17a has extending therefrom a pair of conductive high-voltage terminals 32 and a high-voltage bias terminal 33. A conductive base member 38 is conductively attached to the bias terminal 37 and surrounds and is insulated from the pair of high-voltage terminals 32 by the insulator 17a. The base member 38 has a bayonet lock recess 38a therein.

Figure 5:
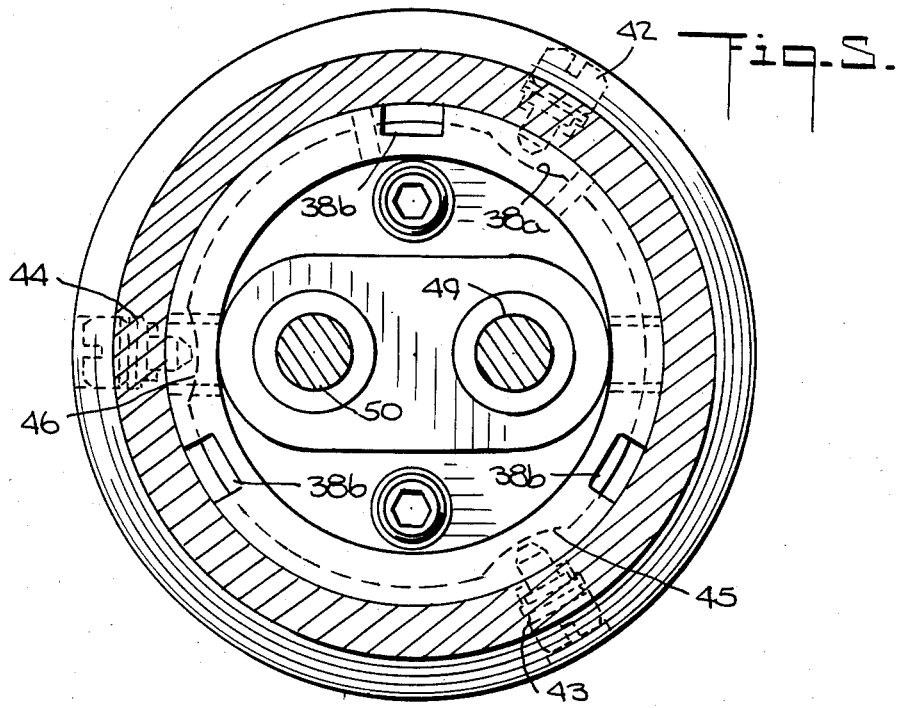
FIG. 5 is a sectional view of the FIG. 4 apparatus, taken along line 5—5 of FIG. 4.
Figure 6:
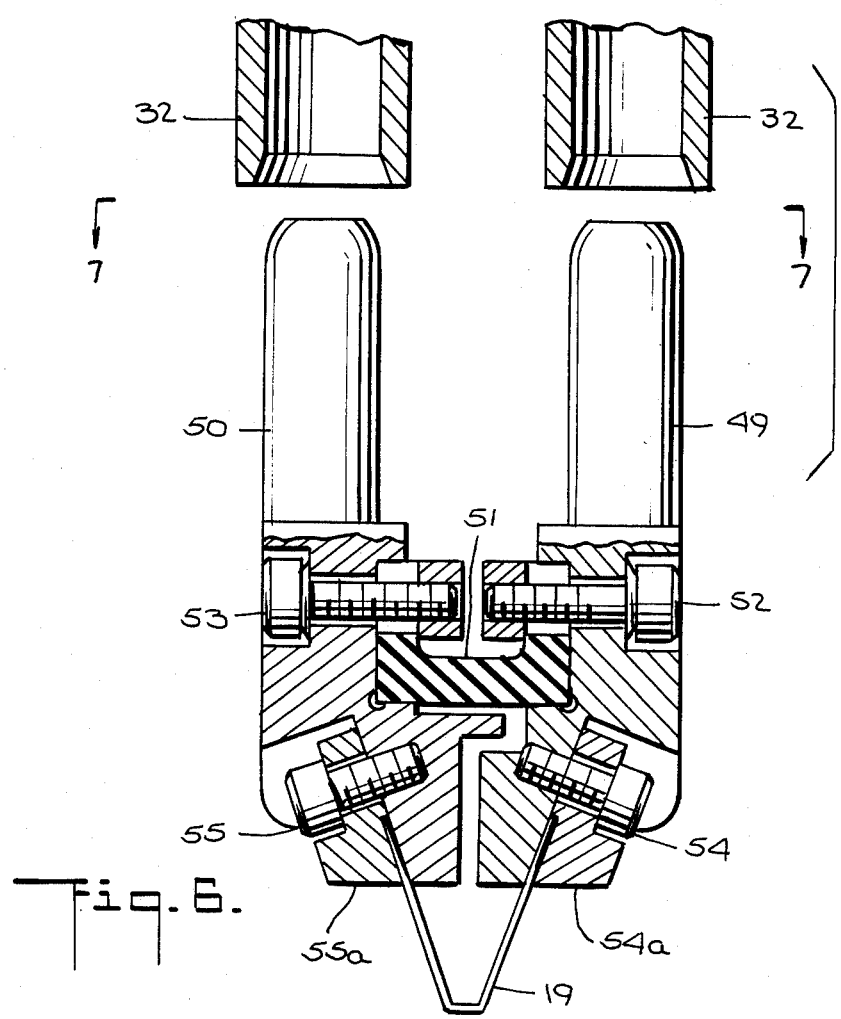
FIG. 6 is a sectional view, to an enlarged scale, of a portion of the FIG. 4 apparatus.
Figure 7:
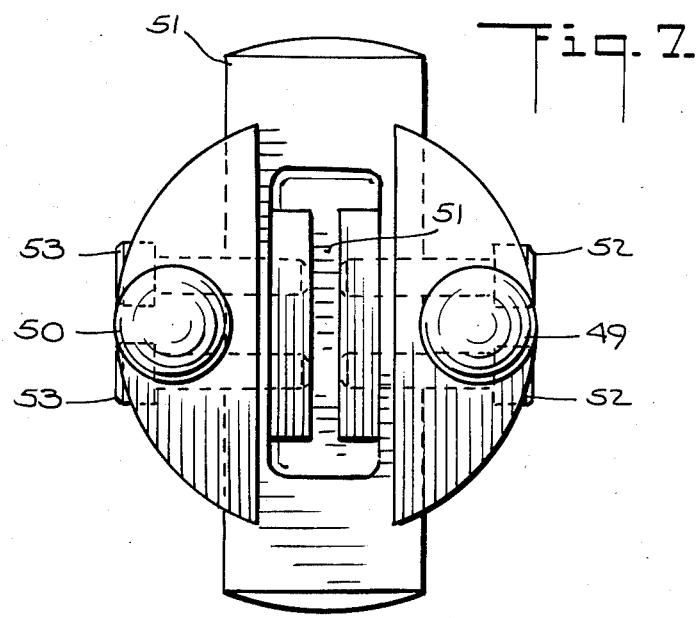
FIG. 7 is a plan view of a portion of the FIG. 6 apparatus, taken along line 6—6 of FIG. 7.

Referring to FIG. 4, the apparatus comprises an electron-beam gun including a corona ring assembly 40 having a housing 41 for mating with the base member 38 and having a bayonet lock 42 protruding internally therefrom for locking in the recess 38a of the base member. As represented in FIG. 4, the position of the bayonet lock 42 and the recess 38a is displaced circumferentially around the cartridge for convenience of drawing. The actual position of the bayonet lock 42 and the recess 38a is represented in FIG. 5, where it may be seen that there are two additional bayonet locks 43, 44 and associated recesses 45, 46. Thus, the cartridge housing 41 may be placed over the base member 38 with the bayonet lock member initially in a slot 38b and the cartridge housing 41 may be rotated until the spring 48 pushes the bayonet lock member 49a into the recess 38a for locking the housing on the base member as represented in FIG. 5. The bayonet locks 43, 44 operate in a similar manner.

The apparatus includes a pair of high-voltage terminals 49, 50 supported in the cartridge housing by an insulating member 51 for connection to the pair of high-voltage terminals 32. Each of terminals 32a preferably is in two pieces, one part being cast into insulator 17a and a second part threading into the first part. Suitable set screws such as 51a fix the position of insulating member 51 in housing member 41a.

The apparatus also includes a cathode filament 19 included in the cartridge and connected to the pair of high-voltage terminals 49, 50 in the housing by suitable screws 54, 55 and clamping blocks 54a, 55a. Suitable screws 52, 53 attach the high-voltage terminals 49, 50 to the supporting insulating member 51, represented also in FIGS. 6 and 7. The grid element 56 to which a biasing voltage is applied to control magnitude of electron beam flow is held in position by a set screw 57 in member 41a, which may be adjusted by removing housing 41 over member 41a. The cartridge may be changed in, for example, fifteen minutes or, alternatively, the filament within the cartridge may be changed in 30 minutes. The grid cup 56 preferably is made of mu metal which is expensive and difficult to fabricate. Preferably members 41a and 56 are fabricated seperately, allowing a less expensive material to be used for member 41a.

Referring now more particularly to FIGS. 8-10, inclusive, a valve for allowing an electron beam to pass along a path in one portion of the apparatus to another portion of the apparatus in an open position of the valve, and for isolating the one portion of the apparatus from the other, in a closed position of the valve, comprises driven means 61 having a passage 62 for the electron beam therethrough in one position and for sealing an opening 63 for the electron beam in the apparatus in another position. The apparatus includes drive means 64 having a passag 65 for the electron beam therethrough in one position and displaceable transversely of the electron beam path for displacing the driven means 61 axially of.the electron-beam path in a final increment of displacement for sealing the opening 63.

The driven means 61 and the drive means 64 of the valve are individually of generally wedge-shaped configuration. The valve includes a base member 66, and the drive means 64 is slidable with respect to the base member 66, and the driven means 61 is slidable with respect to the drive means 64. The driven means 61 includes a resilient sealing ring 67 which may be of suitable elastomeric material, for example, ethylene propylene, for sealing the opening 63 in the apparatus. The driven means 61 has a first surface 68 for closing the opening 63 in the apparatus and has a second surface 69 adjacent the drive means 64 and which is obliquely disposed with respect to the first surface 68. The drive means 64 has a surface 70 adjacent the driven means 61 which is parallel to the obliquely disposed surface 69 of the driven means 61. The valve includes a stop 71 on the base member and the driven means 61 is displaceable transversely of the electron beam path from one position at which the passage 62 is aligned with the opening 63 and the passage 65 to a position at which the driven means 61 strikes the stop.

The adjacent surface 70 of the drive means 64 is displacable transversely of the opening 63 in the apparatus after the driven means 61 has struck the stop 71 for displacing the driven means 61 axially of the electron beam path for sealing the opening 63 in the apparatus, as represented in FIGS. 9 and 10.

The valve includes precision bearings, preferably cross-roller bearings 72 and 73 disposed on the obliquely disposed surface 69 of the driven means 61 and on the adjacent surface 70 of the drive means 65. The valve also includes similar precision bearings 74 and 75 disposed on the base members 66 and on the drive means 64 to enable optical viewing of the welded seam, as will be described.

The valve also includes an optical prism 76 disposed on the drive means 64 and positioned in the electron-beam path when the drive means 64 is positioned as in FIG. 9 to cause the driven means 61 to seal the opening 63 in the apparatus. The optical prism, which is precisely positioned enables a television camera to view the object being welded and the welded seam.

The apparatus also includes a suitable actuator 80 of a hollow shaft electric motor type having a drive rod 81 for displacing the drive means 64 in response to suitable control signals. Thus, the driven means 61 and the drive means 64 have their passages 62, 65 aligned with the opening 63 in the apparatus to form an electron-beam path during operation when the drive means 64 is displaced to its alternate operative position when the rod 81 is withdrawn to the right as compared with its position represented in FIG. 9. The driven means 62 and the drive means 64 are displaced to the positions represented in FIGS. 9 and 10 to seal the vacuum in the electron gun and also to enable television camera viewing of the welded seam. As represented in FIG. 9, a spring plunger 82 contacts the driven means 61 and pushes driven means 61 relative to drive means 64 when the drive means 64 is initially withdrawn to the right, causing driven means 61 initially to move axially of the electron beam until arm 64a causes driven means to move to the right for aligning passages 62, 65 with the opening 63.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Electron-beam welding apparatus comprising:
   an outer housing;
   solid dielectric insulator means in said outer housing and having electrical conductors disposed therein and having a first liquid flow path associated therewith;
   said solid dielectric insulator means including a portion of said first liquid flow path, another portion of said first liquid flow path lying between said solid dielectric insulator means and said outer housing;
   a cathode connected through said conductors in said insulator means to high-voltage supply means, said first liquid flow path having a portion near said conductors for a first liquid for cooling said conductors and said insulator means, which are heated by said cathode, by flow of said first liquid in said path;
   a second liquid flow path near an outer portion of said dielectric insulator means and near said first liquid flow path for a second liquid for cooling said first liquid;
   an anode;
   valve means for sealing said cathode and said anode in said outer housing in one position of said valve and for allowing the passage therethrough of an electron beam in another position of said valve; and
   means for controlling the electron beam.

2. In electron beam welding apparatus, a valve for allowing an electron beam to pass along a path in one portion of the apparatus to another portion of the apparatus, in an open position of the valve, and for isolating the one portion of the apparatus from the other, in a closed position of the valve, the valve comprising:
   driven means having a passage for the electron beam therethrough in one position and for sealing an opening for the electron beam in the apparatus in another position;
   drive means having a passage for the electron beam therethrough in one position and displaceable transversely of the electron-beam path for displacing said driven means transversely of the electron-beam path and for displacing said driven means axially of the electron beam path in a final increment of displacement for sealing said opening in the apparatus;
   said driven means having a first surface for closing said opening in the apparatus and having a second surface adjacent said drive means and which is obliquely disposed with respect to said first surface.

3. In electron beam welding apparatus, a valve for allowing an electron beam to pass along a path in one portion of the apparatus to another portion of the apparatus, in an open position of the valve, and for isolating the one portion of the apparatus from the other, in a closed position of the valve, the valve comprising:
   driven means having a passage for the electron beam therethrough in one position and for sealing an opening for the electron beam in the apparatus in another position;
   drive means having a passage for the electron beam therethrough in one position and displaceable transversely of the electron-beam path for displacing said driven means transversely of the electron-beam path and for displacing said driven means axially of the electron beam path in a final increment of displacement for sealing said opening in the apparatus;
   said driven means having a first surface for closing said opening in the apparatus and having a second surface adjacent said drive means and which is obliquely disposed with respect to said first surface;
   a base member;
   said drive means being slidable with respect to said base member and said driven means being slidable with respect to said drive means; and
   precision bearings disposed on said base member and on said drive means.

4. Apparatus in accordance with claim 1, in which said first liquid comprises dielectric oil.

5. Apparatus in accordance with claim 1, in which said first liquid flow path comprises a plurality of interconnected channels extending outwardly from the vicinity of said electrical conductors.

6. A valve in accordance with claim 2, in which said drive means has a surface adjacent said driven means which is parallel to said obliquely disposed surface.

7. A valve in accordance with claim 6, which includes a stop and in which said driven means is displaceable transversely from said one position to a position at which said driven means strikes said stop.

8. A valve in accordance with claim 7, in which said adjacent surface of said drive means is displaceable transversely of said opening in the apparatus after said driven means has struck said stop for displacing said driven means axially of the electron beam path for sealing said opening in the apparatus.

9. A valve in accordance with claim 8, which includes precision bearings disposed on said obliquely disposed surface of said driven means and on said adjacent surface of said drive means.

10. A valve in accordance with claim 3, which includes an optical prism disposed on said drive means and positioned in said electron beam path when said drive means is positioned to cause said driven means to seal the opening in the apparatus, said optical prism enabling a television camera to view the object to be welded.

* * * * *